(12) United States Patent
Yang et al.

(10) Patent No.: US 11,855,174 B2
(45) Date of Patent: Dec. 26, 2023

(54) HIGH ELECTRON MOBILITY TRANSISTOR HAVING CONDUCTIVE PLATE ON PASSIVATION LAYER AND METHOD FOR FORMING THE SAME

(71) Applicant: UNITED MICROELECTRONICS CORP., Hsin-Chu (TW)

(72) Inventors: Po-Yu Yang, Hsinchu (TW); Hsun-Wen Wang, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 337 days.

(21) Appl. No.: 17/203,723

(22) Filed: Mar. 16, 2021

(65) Prior Publication Data

US 2022/0238694 A1 Jul. 28, 2022

(30) Foreign Application Priority Data

Jan. 22, 2021 (CN) .......................... 202110086554.8

(51) Int. Cl.
*H01L 29/66* (2006.01)
*H01L 29/778* (2006.01)

(52) U.S. Cl.
CPC .... *H01L 29/66431* (2013.01); *H01L 29/7786* (2013.01)

(58) Field of Classification Search
CPC .................. H01L 29/66431; H01L 29/7786
USPC .......................................................... 257/183
See application file for complete search history.

(56) References Cited

U.S. PATENT DOCUMENTS

| 8,680,535 | B2 | 3/2014 | Yao | |
|---|---|---|---|---|
| 9,960,264 | B1 | 5/2018 | Chen | |
| 2011/0204380 | A1 | 8/2011 | Yoshioka | |
| 2016/0380089 | A1* | 12/2016 | Bahl | H01L 24/49 |
| | | | | 257/192 |
| 2017/0345918 | A1* | 11/2017 | Iucolano | H01L 29/402 |
| 2018/0138306 | A1* | 5/2018 | Jeon | H01L 29/66462 |
| 2019/0378790 | A1* | 12/2019 | Bohr | H01L 21/823481 |
| 2020/0052103 | A1* | 2/2020 | Tao | H01L 29/7787 |
| 2020/0365718 | A1* | 11/2020 | Lee | H01L 29/205 |

* cited by examiner

*Primary Examiner* — Matthew E. Gordon
(74) *Attorney, Agent, or Firm* — Winston Hsu

(57) ABSTRACT

A high electron mobility transistor (HEMT) includes a substrate, a channel layer disposed on the substrate, a barrier layer disposed on the channel layer, a first passivation layer disposed on the barrier layer, a plurality of trenches through at least a portion of the first passivation layer, and a conductive plate structure disposed on the first passivation layer. The conductive plate structure includes a base portion over the trenches and a plurality of protruding portions extending from a lower surface of the base portion and into the trenches.

19 Claims, 12 Drawing Sheets

HIGH ELECTRON MOBILITY TRANSISTOR HAVING CONDUCTIVE PLATE ON PASSIVATION LAYER AND METHOD FOR FORMING THE SAME

BACKGROUND OF THE INVENTION

1. Field of the Invention

The present invention relates to semiconductor technology, and more particularly relates to a high electron mobility transistor (HEMT) and method for forming the same.

2. Description of the Prior Art

A high electron mobility transistor (HEMT) is a new type of field effect transistor which usually includes a heterostructure formed by stacking multiple semiconductor layers. By selecting materials of the semiconductor layers, a two-dimensional electron gas (2DEG) layer may be formed at a heterojunction of the heterostructure formed by bonding two semiconductor layers having different band gaps. The two-dimensional electron gas layer may be utilized as a current channel region of the high electron mobility transistor, and is able to provide a high switching speed and a high response frequency of the high electron mobility transistor. HEMTs have been widely used in technical fields such as power converters, low noise amplifiers, radio frequency (RF) or millimeter wave (MMW).

To fulfill the increasing demands for higher frequency and lower power consumption, numerous efforts have been made to optimize the performance of HEMTs. How to reduce leakage current and increase the breakdown voltage and power efficiency are important subjects in the field.

SUMMARY OF THE INVENTION

In light of the above, the present invention is directed to provide a high electron mobility transistor (HEMT) and a method for forming the same. The HEMT provided by the present invention particularly has a conductive plate structure disposed between a gate structure and a drain structure of the HEMT, wherein the conductive plate structure has a base portion and a plurality of protruding portions that extend from a lower surface of the base portion toward a direction to the channel layer of the HEMT. The conductive plate structure may adjust electric field of the adjacent regions, so that the peak value of the electric field near the edge of the gate structure may be reduced. Accordingly, the gate leakage current may be reduced, and the breakdown voltage may be increased.

According to one embodiment of the present invention, a high electron mobility transistor is disclosed, which includes a substrate, a channel layer disposed on the substrate, a barrier layer disposed on the channel layer, a first passivation layer disposed on the barrier layer, a plurality of trenches through at least a portion of the first passivation layer, and a conductive plate structure disposed on the first passivation layer, wherein the conductive plate structure includes a base portion over the trenches, and a plurality of protruding portions extending from a lower surface of the base portion and into the trenches.

According to another embodiment of the present invention, method for forming a high electron mobility transistor is disclosed, which includes the steps of providing a substrate, forming a channel layer, a barrier layer, and a first passivation layer sequentially on the substrate, forming a plurality of trenches through at least a portion of the first passivation layer, forming a second passivation layer on the first passivation layer and covering along sidewalls and bottom surfaces of the trenches, and forming a conductive plate structure on the second passivation layer and filling the trenches.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
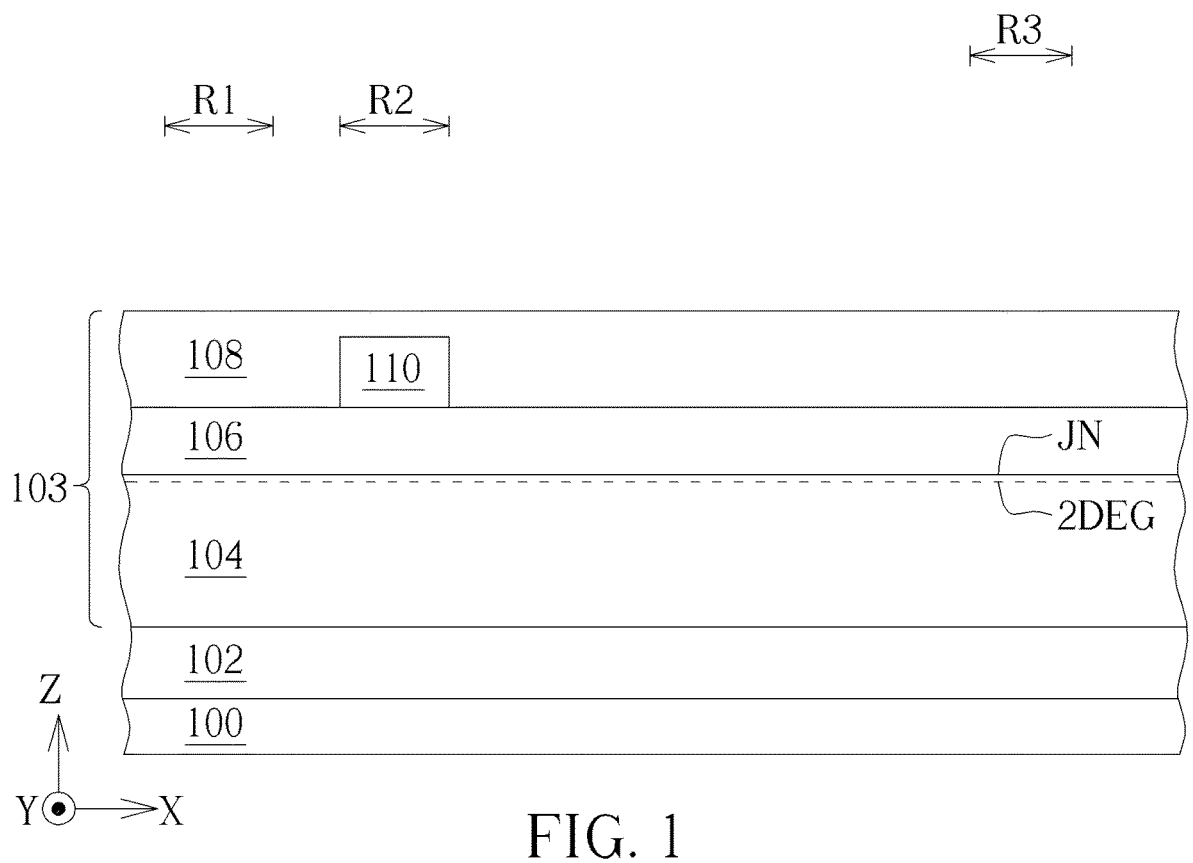
FIG. 1, FIG. 2, FIG. 3, and FIG. 4 are schematic cross-sectional views of a high electron mobility transistor at different steps of a manufacturing process according to an embodiment of the present invention.

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

The accompanying drawings are schematic drawings and included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

It will be understood that when an element or layer is referred to as being "on" or "connected to" another element or layer, it may be directly on or directly connected to the other element or layer, or intervening elements or layers may be presented. In contrast, when an element is referred to as being "directly on" or "directly connected to" another element or layer, there are no intervening elements or layers presented.

The terms "wafer" and "substrate" used herein include any structure having an exposed surface onto which a layer is deposited according to the present invention, for example, to form the circuit structure. The term substrate is understood to include semiconductor wafers, but is not limited thereto. The term substrate is also used to refer to semiconductor structures during processing, and may include other layers that have been fabricated thereupon.

In the specification, when devices are described as "electrically connected" or "electrically coupled", the devices are not necessarily equipotential. In some cases, other circuit components may be electrically connected between the devices.

The high electron mobility transistor (HEMT) provided by the present invention may be a depletion mode (normally-on) transistor or an enhancement mode (normally-off) transistor. The HEMT provided by the present invention may be used in power converters, low noise amplifiers, radio frequency (RF) or millimeter wave (MMW) and other technical fields.

The types and shapes of the gate structure, the drain structure, and the source structure of the high electron mobility transistor described in the embodiments of the present invention are only examples for the purpose of convenience of drawing and description, and are not used to limit the scope of the present invention. Moreover, in the following embodiments, high electron mobility transistors including metal-semiconductor gate structures are taken as examples for illustration. It should be understood that in other embodiments, high electron mobility transistor may include a metal gate structure.

FIG. 1, FIG. 2, FIG. 3, and FIG. 4 are schematic cross-sectional views of a high electron mobility transistor along an XZ plane at different steps of a manufacturing process according to an embodiment of the present invention.

Please refer to FIG. 1. The method for forming the high electron mobility transistor provided by the present invention includes providing a substrate 100. A stacked structure 103 is then formed on the substrate 100. The layers of the stacked structure 103 includes at least a channel layer 104, a barrier layer 106 on the channel layer 104, and a first passivation layer 108 on the barrier layer 106. The stacked structure 103 may include a source region R1, a drain region R3, and a gate region R2 between the source region R1 and the drain region R3.

As shown in the present embodiment, when the high electron mobility transistor is designed to include a metal-semiconductor gate structure, a semiconductor gate layer 110 may be formed on the barrier layer 106 in the gate region R2 and covered by the first passivation layer 108 subsequently formed. In addition, in order to reduce lattice dislocation defects or lattice mismatch defects in the stacked structure 103, a buffer layer 102 may be formed between the substrate 100 and the stacked structure 103 to serve as a lattice transition region or a stress buffer. In some embodiments, the buffer layer 102 may provide stress modulation to the channel layer 104 of the stacked structure 103, thereby adjusting the energy band structure of the channel layer 104.

The material of the substrate 10 may include silicon, silicon carbide (SiC), sapphire, gallium nitride (GaN), aluminum nitride (AlN), or other suitable materials, but is not limited thereto.

The materials of the buffer layer 102, the channel layer 104, and the barrier layer 106 may respectively include gallium nitride (GaN), aluminum gallium nitride (AlGaN), graded aluminum gallium nitride (graded AlGaN), aluminum indium nitride (AlInN), indium gallium nitride (InGaN), aluminum gallium indium nitride (AlGaInN), doped gallium nitride (doped GaN), aluminum nitride (AlN), or a combination thereof, but is not limited thereto. According to an embodiment of the present invention, the material of the buffer layer 102 may include aluminum nitride (AlN), the material of the channel layer 104 may include gallium nitride (GaN), and the material of the barrier layer 106 may include aluminum gallium nitride (AlGaN).

By selecting appropriate materials for the channel layer 104 and the barrier layer 106, the energy band near the junction JN between the channel layer 104 and the barrier layer 106 may bend to form a potential well. The free electrons formed by the spontaneous polarization and piezoelectric polarization of the channel layer 104 may converge in the potential well, so that a two-dimensional electron gas layer 2DEG having high electron density may be formed near the surface of the channel layer 104 immediately below the junction JN. The two-dimensional electron gas layer 2DEG may serve as a planar-type current channel when the high electron mobility transistor is at on-state.

In some embodiments, the buffer layer 102, the channel layer 104 and the barrier layer 106 may respectively have a single-layered structure or a superlattice structure including multiple semiconductor thin layers. By selecting the materials and thicknesses of each of the semiconductor thin layers, the band structure, the strength of the polarization field and/or the carrier distribution near the junction JN may be adjusted, thereby adjusting the carrier distribution and carrier mobility of the two-dimensional electron gas layer 2DEG for product requirements.

The semiconductor gate layer 110 controls conducting or cut-off of the two-dimensional electron gas layer 2DEG in the gate region R2. According to an embodiment of the present invention, the semiconductor gate layer 110 may include group III-V compound semiconductors. The semiconductor gate layer 110 may have an n-type (negative type) conductivity or a p-type (positive type) conductivity according to the application needs. The built-in voltage of the semiconductor gate layer 110 may pull up the potential well near the junction JN between the barrier layer 106 and the channel layer 104, thereby obtaining a normally-off operation of the high electron mobility transistor. According to an embodiment of the present invention, the semiconductor gate layer 110 may include p-type gallium nitride (p-GaN) having dopants such as magnesium (Mg), iron (Fe) or other suitable p-type dopants.

The first passivation layer 108 covers the stacked structure 103 and serves as an isolation and passivation layer for the stacked structure 103. The first passivation layer 108 also protects the underneath material layers from damage during the subsequent manufacturing process. According to an embodiment of the present invention, the material of the first passivation layer 108 may include a dielectric material, such as aluminum nitride (AlN), aluminum oxide ($Al_2O_3$), boron nitride (BN), silicon nitride ($Si_3N_4$), silicon oxide ($SiO_2$), zirconia ($ZrO_2$), hafnium oxide ($HfO_2$), lanthanum oxide ($La_2O_3$), lutetium oxide ($Lu_2O_3$), lanthanum oxide (LaLuO_3), high-k dielectric materials, other suitable dielectric materials, or a combination thereof, but is not limited thereto.

According to an embodiment of the present invention, the structure shown in FIG. 1 may be obtained by successively forming the buffer layer 102, the channel layer 104, the barrier layer 106, and the semiconductor gate layer 110 on the substrate 100 through, for example, a heteroepitaxy growth process. After that, a patterning process may be performed to remove the unnecessary portion of the semiconductor gate layer 110 outside the gate region R2, and the first passivation layer 108 is then formed on the barrier layer 106 and covers the remaining portion of the semiconductor gate layer 110. According to an embodiment of the present invention, the heteroepitaxy growth process may include molecule beam epitaxy (MBE), metal-organic chemical vapor deposition (MOCVD), or hydride vapor phase deposition (HVPE), but is not limited thereto. The first passivation layer 108 may be formed by atomic layer deposition (ALD), plasma enhanced atomic layer deposition (PEALD), chemical vapor deposition (CVD), plasma enhanced chemical vapor deposition (PECVD), and low pressure chemical vapor deposition (LPCVD), but is not limited thereto.

Figure 2:
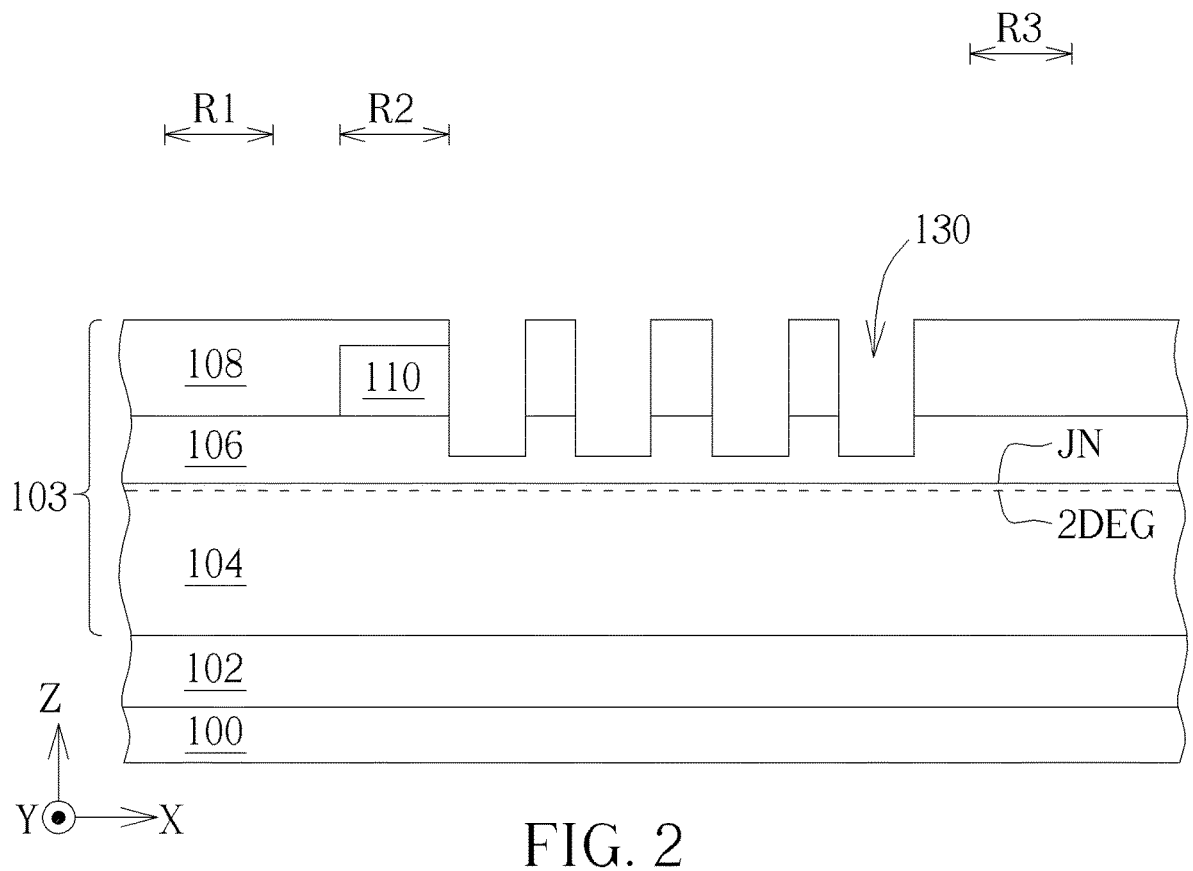

Please refer to FIG. 2. Following, a patterning process may be performed to form a plurality of trenches 130 in the stacked structure 103 and between the gate region R2 and the drain region R3 of the stacked structure 103. The depths of the trenches 130 may be adjusted according to design needs. In the embodiment shown in FIG. 2, the trenches 130 may penetrate through the first passivation layer 108 and extend into an upper portion of the barrier layer 106. The process for forming the trenches 130 may include the steps of forming a photoresist layer (not shown) on the first passivation layer 108, forming a plurality of openings in the photoresist layer to expose portions of the first passivation layer 108 in the predetermined regions for forming the trenches 130, performing an etching process (such as an ICP-RIE process) using the photoresist layer as an etching mask to remove the exposed portions of the first passivation layer 108 and the barrier layer 106 thereby forming the trenches 130, and then removing the remaining photoresist layer.

The distance between the semiconductor gate layer 110 and the trench 130 closest to the semiconductor gate layer 110 may be adjusted according to design needs and may be approximately zero or larger than zero. For example, in the embodiment shown in FIG. 2, the distance between the semiconductor gate layer 110 and the trench 130 closest to the semiconductor gate layer 110 is approximately zero, such that the sidewall of the semiconductor gate layer 110 and the sidewall of the trench 130 closest to the semiconductor gate layer 110 may be aligned with each other along the vertical direction, or the sidewall of the semiconductor gate layer 110 may be exposed from the sidewall of the trench 130 closest to the semiconductor gate layer 110. In other embodiments when the distance between the semiconductor gate layer 110 and the trench 130 closest to the semiconductor gate layer 110 is larger than zero, the semiconductor gate layer 110 and the trenches 130 may be separated by the first passivation layer 108.

Figure 3:
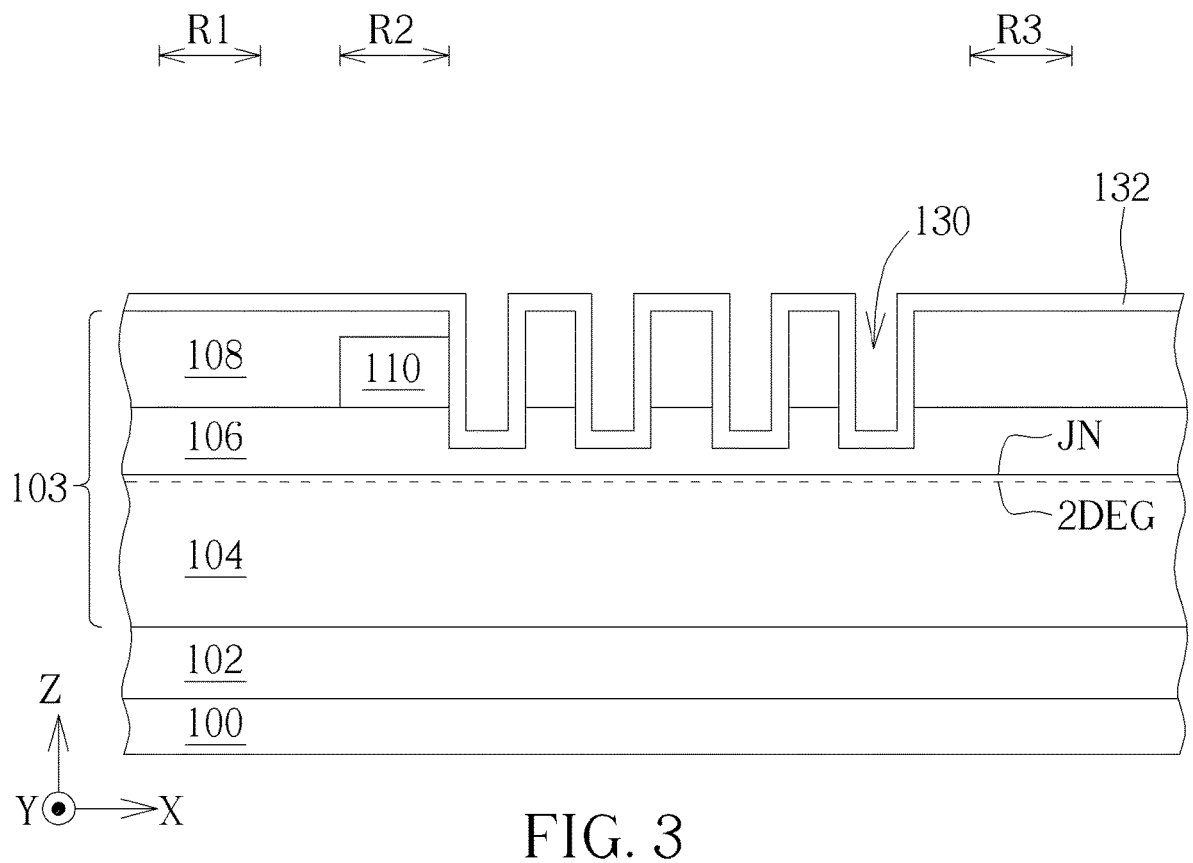

Please refer to FIG. 3. Subsequently, a second passivation layer 132 is formed on the first passivation layer 108 and covering along the sidewalls and bottom surfaces of the trenches 130. The material of the second passivation layer 132 may include a dielectric material, such as aluminum nitride (AlN), aluminum oxide ($Al_2O_3$), boron nitride (BN), silicon nitride ($Si_3N_4$), silicon oxide ($SiO_2$), zirconia ($ZrO_2$), hafnium oxide ($HfO_2$), lanthanum oxide ($La_2O_3$), lutetium oxide ($Lu_2O_3$), lanthanum oxide ($LaLuO_3$), high-k dielectric materials, other suitable dielectric materials, or a combination thereof, but is not limited thereto. According to an embodiment of the present invention, the first passivation layer 108 and the second passivation layer 132 may include a same dielectric material, such as silicon nitride ($Si_3N_4$). In the present invention, the first passivation layer 108 and the second passivation layer 132 collectively serve as the passivation layer of the high electron mobility transistor.

Figure 4:
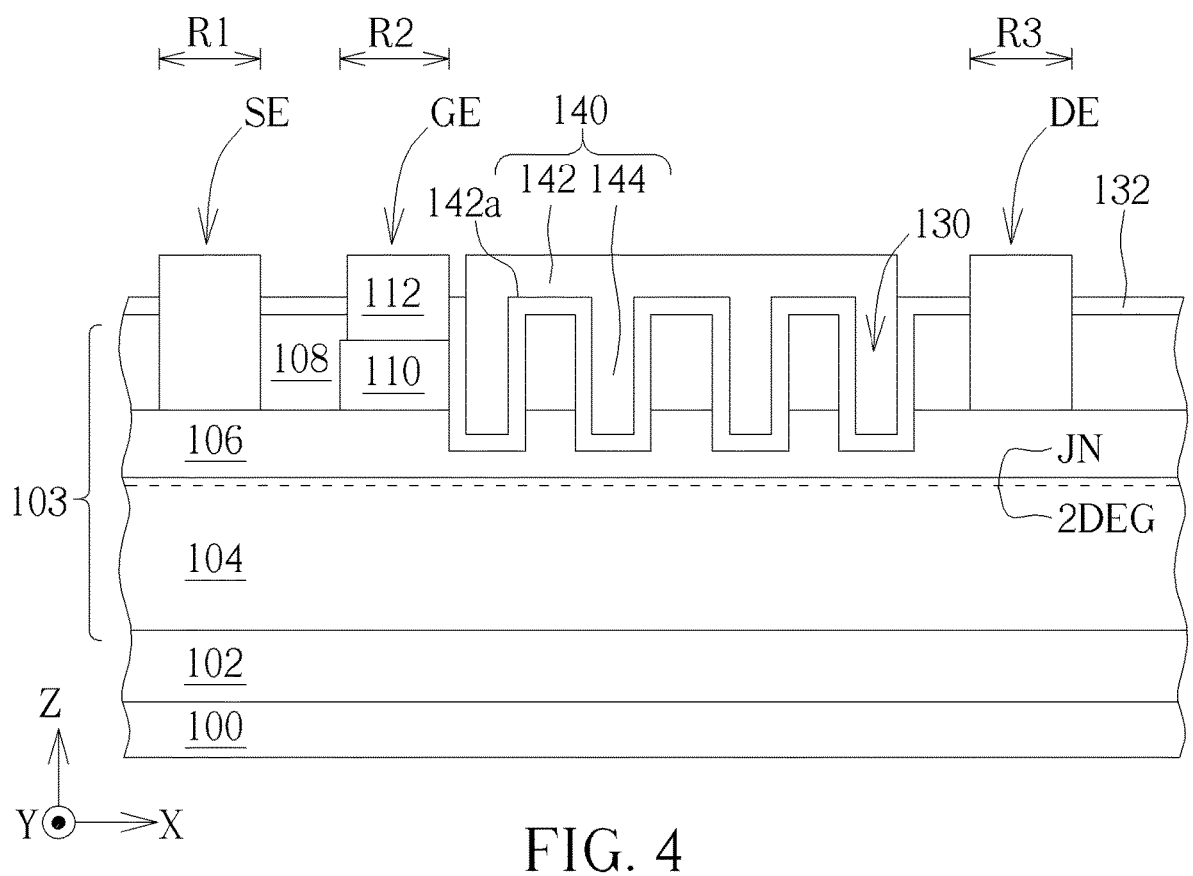

Please refer to FIG. 4. Subsequently, a conductive plate structure 140 is formed on the second passivation layer 132, which include a base portion 142 over the trenches 130 and a plurality of protruding portions 144 that extend downward (toward the channel layer 104) from a lower surface 142a of the base portion 142 and into the trenches 130 to fill the trenches 130. The material of the conductive plate structure 140 may include metal, for example, gold (Au), tungsten (W), cobalt (Co), nickel (Ni), titanium (Ti), molybdenum (Mo), copper (Cu), aluminum (Al), tantalum (Ta), palladium (Pd), platinum (Pt), a compound of the above materials, a composite layer of the above materials, or an alloy of the above materials, but is not limited thereto.

The shapes and dimensions of the protruding portions 144 are determined by the shapes and dimensions of the trenches 130 and the thickness of the second passivation layer 132 on the sidewalls and bottom surfaces of the trenches 130. In the embodiment shown in FIG. 4, the bottom portions of the protruding portions 144 are located below the upper surface of the barrier layer 106 and above the lower surface of the barrier layer 106. In other words, the bottom portions of the protruding portions 144 are located between the upper surface and the lower surface of the barrier layer 106, and are separated from the barrier layer 106 by the second passivation layer 132 disposed therebetween. The conductive plate structure 140 is not in direct contact with the barrier layer 106.

The conductive plate structure 140 may be formed by any suitable process. For example, the conductive plate structure 140 may be formed by forming a conductive material (not shown) on the second passivation layer 132 and then patterning the conductive material to obtain the conductive plate structure 140. In some embodiments, the conductive material may be patterned by performing a lift-off process including the steps of forming a photoresist layer (not shown) on the second passivation layer 132, patterning the photoresist layer to form a photoresist opening in the photoresist layer and exposing the trenches 130, forming a conductive material (such as a metal layer) on the photoresist layer in a blanket manner and filling the trenches 130, and then performing a solvent treatment to lift off the photoresist layer so that the portion of the conductive material on the photoresist layer may be concurrently removed and the conductive material is therefore patterned. The remaining portion of the conductive material becomes the conductive plate structure 140. In other embodiments of the present invention, the conductive plate structure 140 may be formed by a patterning process including the steps of forming a conductive material (such as a metal layer) on the second passivation layer 132 and filling the trenches 130, forming a photoresist layer on the conductive material to define the pattern of the conductive plate structure 140, and then using the photoresist layer as an etching mask to etch (using dry etching process or wet etching process) the exposed portions of the conductive material so that the pattern of the photoresist layer is transferred to the conductive material thereby obtaining the conductive plate structure 140. The processes for forming the conductive plate structure 140 are only examples and may be adjusted according to process needs.

Please continue to refer to FIG. 4. A source structure SE, a drain structure DE, and a gate structure GE may be formed in the passivation layer in the source region R1, the drain region R3, and the gate region R2 of the stacked structure 103 at the same time, before, or after the steps of forming the conductive plate structure 140. The method for forming the source structure SE, the drain structure DE, and the gate structure GE may include forming corresponding openings in the passivation layer (the first passivation layer 108, the second passivation layer 132, and/or any additional passivation layer depending on process needs), and then forming the source structure SE, the drain structure DE, and the gate structure GE in the corresponding openings through, for example, the lift-off process or the patterning process previously illustrated, or any other suitable process.

As shown in FIG. 4, the source structure SE and the drain structure DE are disposed at two sides of the gate structure GE, and penetrate through the first passivation layer 108 and the second passivation layer 132 to directly contact the barrier layer 106. According to other embodiment of the present invention, the bottom portions of the source structure SE and the drain structure DE may extend further downward through a portion of the barrier layer 106 and stop in the barrier layer 106, or may extend further downward through the whole thickness of the barrier layer 106 and a portion of the channel layer 104 and stop in the channel layer 104. The materials of the source structure SE and the drain structure DE may include metals, so that metal-semiconductor contacts may be formed between the source structure SE and the barrier layer 106 and between the drain structure DE and the barrier layer 106, which are preferably ohmic contacts and may conduct current when forward biased or reverse biased. The materials of the source structure SE and the drain structure DE may include metals, for example, gold (Au), tungsten (W), cobalt (Co), nickel (Ni), titanium (Ti), molybdenum (Mo), copper (Cu), aluminum (Al), tantalum (Ta), palladium (Pd), platinum (Pt), a compound of the above materials, a composite layer of the above materials, or an alloy of the above materials, but are not limited thereto. According to an embodiment of the present invention, the conductive plate structure 140, the source structure SE, and the drain structure DE may include a same metal. According to another embodiment of the present invention, the conductive plate structure 140, the source structure SE, and the drain structure DE may include different metals.

According to an embodiment of the present invention, the gate structure GE includes the semiconductor gate layer 110 and the metal gate layer 112 on the semiconductor gate layer 110. The interface between the semiconductor gate layer 110 and the metal gate layer 112 is a metal-semiconductor contact, and preferably a Schottky contact having a rectification function. The material of the metal gate layer 112 may include metal, for example, gold (Au), tungsten (W), cobalt (Co), nickel (Ni), titanium (Ti), molybdenum (Mo), copper (Cu), aluminum (Al), tantalum (Ta), palladium (Pd), platinum (Pt), a compound of the above materials, a composite layer of the above materials, or an alloy of the above materials, but is not limited thereto. According to an embodiment of the present invention, the metal gate layer 112, the source structure SE, and the drain structure DE may include a same metal. According to another embodiment of the present invention, the metal gate layer 112, the source structure SE, and the drain structure DE may include different metals.

One feature of the present invention is that, the conductive plate structure 140 between the gate structure GE and the drain structure DE and having the base portion 142 and the protruding portions 144 may provide stress to the stacked structure 103 to modulate the piezoelectric polarization characteristic of the stacked structure 103, and/or may adjust the strength of electric field in the stacked structure 103 when being coupled to a voltage. In this way, the peak strength of the electric field near the edge of the gate structure GE may be reduced, so that the breakdown voltage and the device linearity of the high electron mobility transistor may be improved, which is beneficial for high-voltage applications. When the conductive plate structure 140 is coupled to a voltage, it may also be used as a field plate in the high electron mobility transistor.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

FIG. 5, FIG. 6, FIG. 7, FIG. 8 and FIG. 9 are plan-views of the high electron mobility transistors along an XY plan, illustrating some examples of the arrangements of the trenches 130 and the protruding portions 144 of the conductive plate structure 140 according to some embodiments of the present invention. It should be noted that the protruding portions 144 shown in FIG. 5, FIG. 6, FIG. 7, FIG. 8 and FIG. 9 are integrally connected to a base portion thereupon to form the conductive plate structure having an integral structure. For the sake of simplicity, the base portion is not shown in FIG. 5, FIG. 6, FIG. 7, FIG. 8 and FIG. 9.

Figure 5:
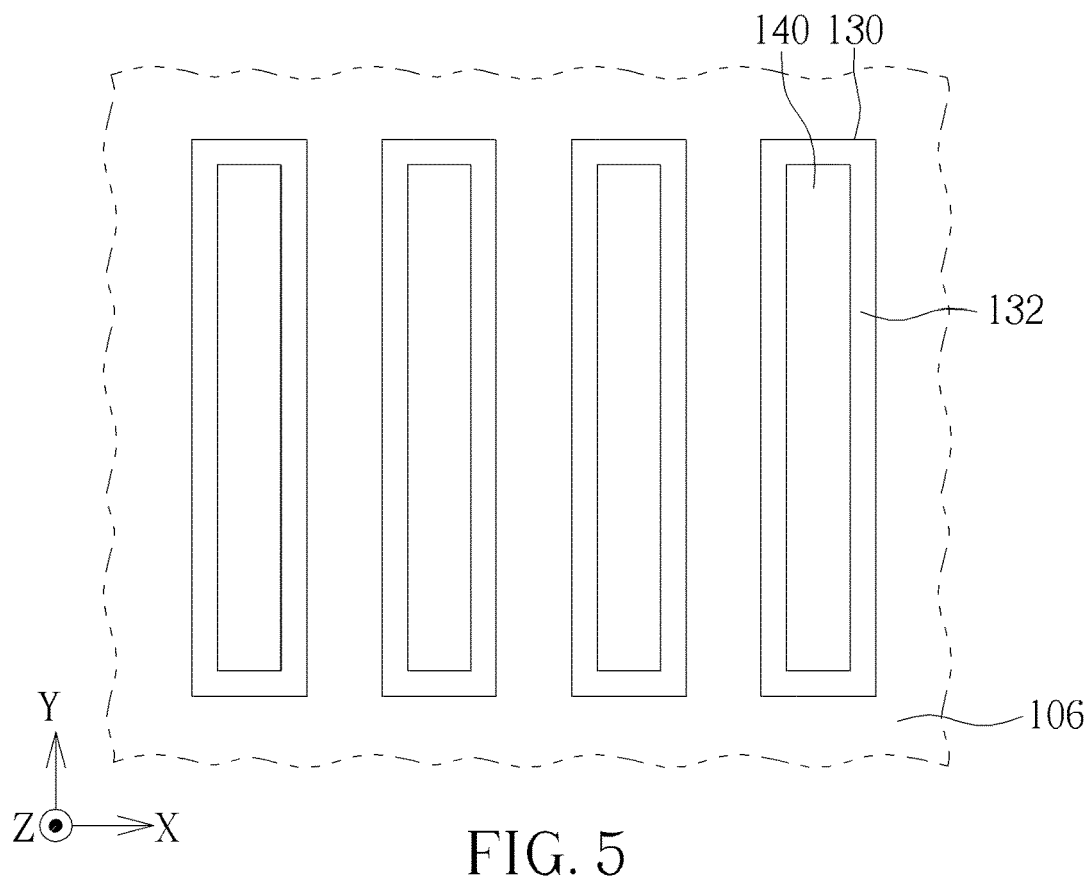
FIG. 5 is a schematic plan-view of a portion of a high electron mobility transistor according to an embodiment of the present invention.

According to the embodiment shown in FIG. 5, the protruding portions 144 and the trenches 130 may extend along a same direction (along the Y direction, for example) and respectively have a stripe shape from a top view. The protruding portions 144 are respectively arranged in a corresponding one of the trenches 130. In other words, each of the protruding portions 144 and one of the trenches 130 are overlapped with each other along a vertical direction (such as the X direction).

Figure 6:
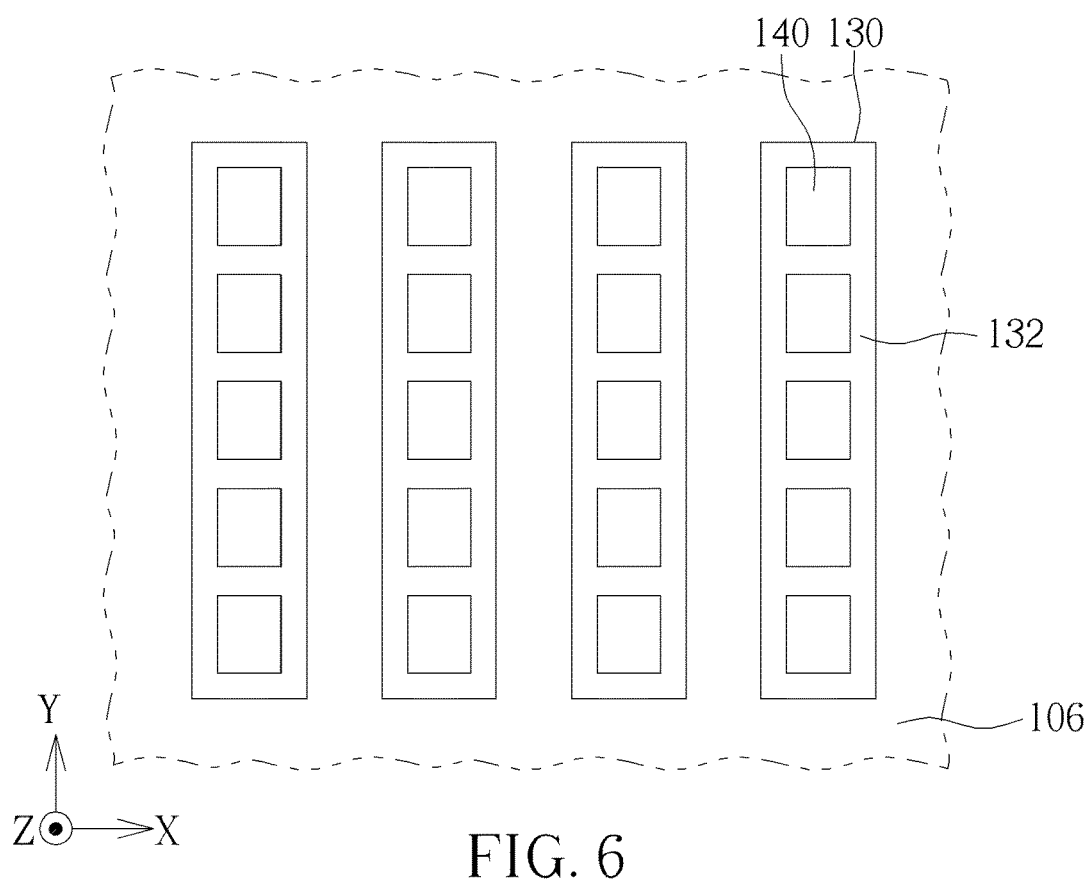
FIG. 6 is a schematic plan-view of a portion of a high electron mobility transistor according to an embodiment of the present invention.

According to the embodiment shown in FIG. 6, the trenches 130 may respectively extend along a direction (along the Y direction, for example) and have a stripe shape from a top view. The protruding portions 144 may respectively have an approximately square shape (or a circular shape) and are grouped into a plurality of groups. The groups of the protruding portions 144 are respectively arranged in a corresponding one of the trenches 130.

Figure 7:
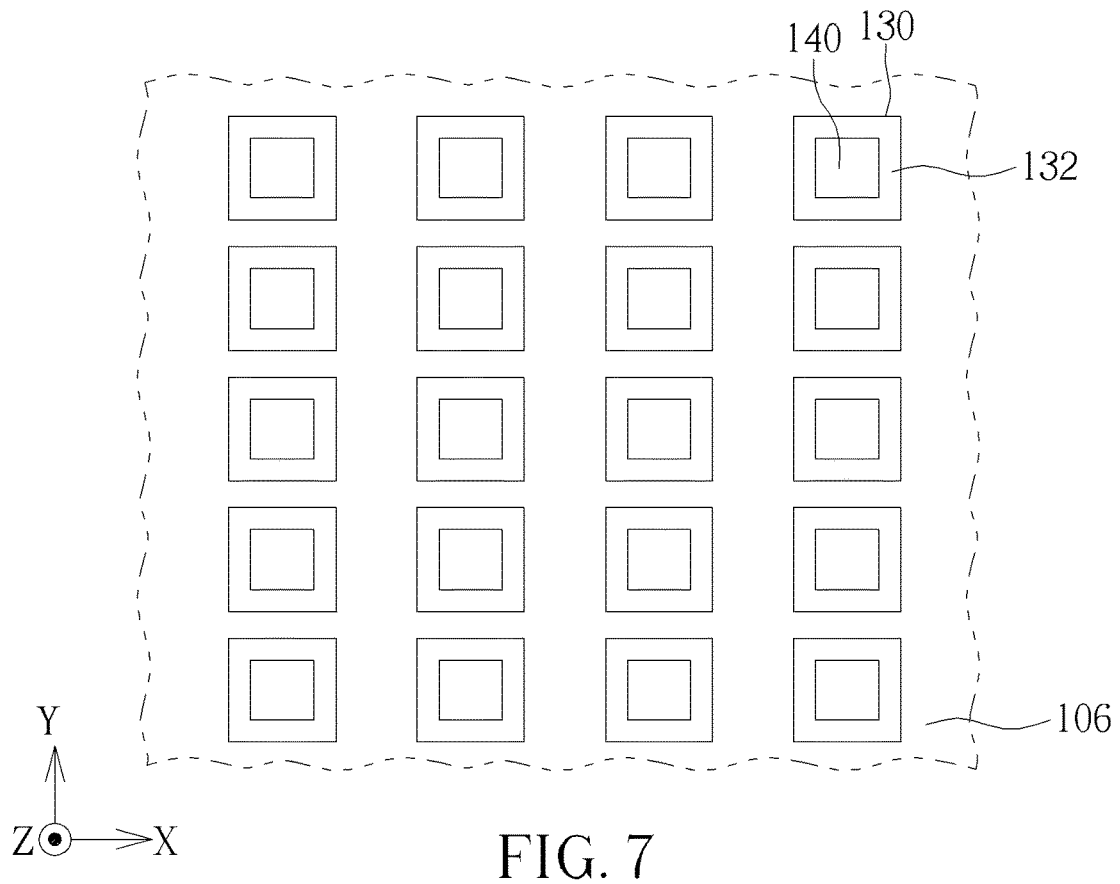
FIG. 7 is a schematic plan-view of a portion of a high electron mobility transistor according to an embodiment of the present invention.

According to the embodiment shown in FIG. 7, the protruding portions 144 and the trenches 130 may respectively have an approximately square shape (or a circular shape). The protruding portions 144 are respectively arranged in a corresponding one of the trenches 130, and are arranged and aligned along the X direction and the Y direction.

Figure 8:
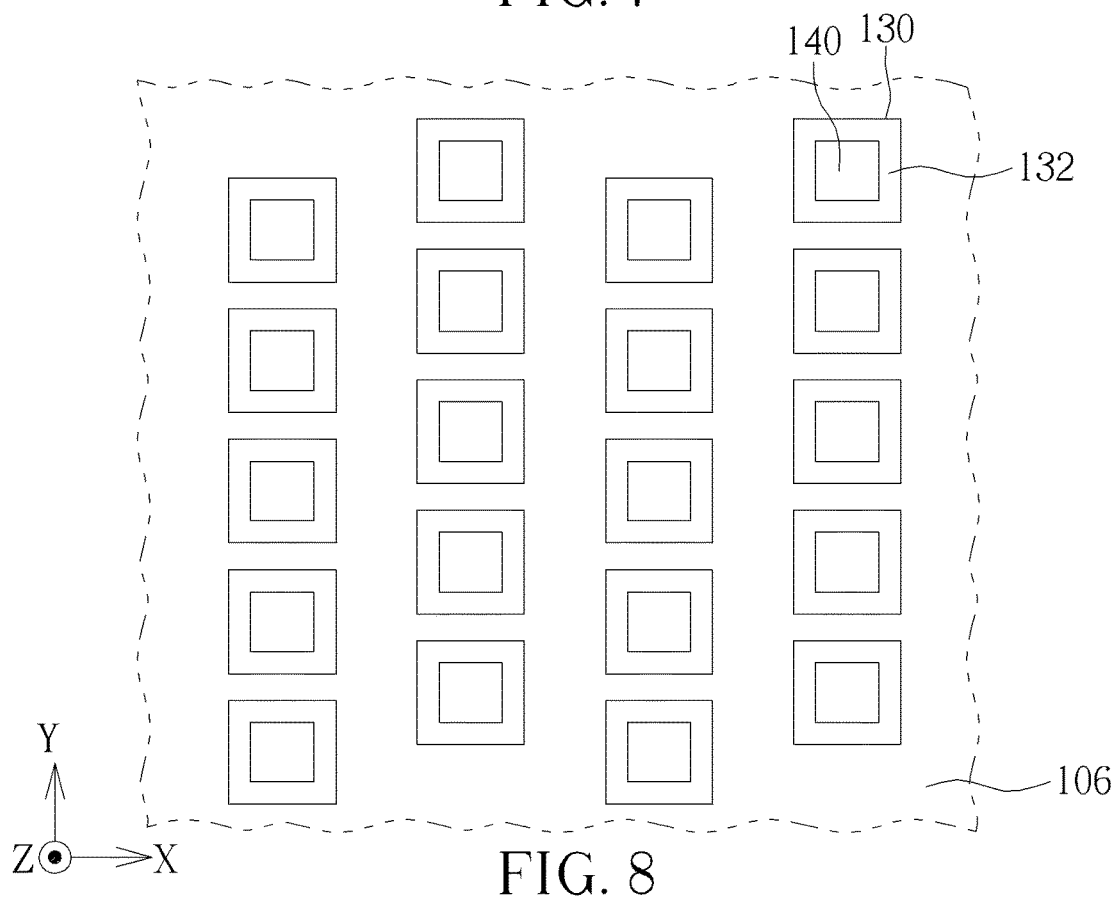
FIG. 8 is a schematic plan-view of a portion of a high electron mobility transistor according to an embodiment of the present invention.

According to the embodiment shown in FIG. 8, the protruding portions 144 and the trenches 130 may respectively have an approximately square shape (or a circular shape). The protruding portions 144 are respectively arranged in a corresponding one of the trenches 130, and are arranged and aligned along the Y direction and staggered along the Y direction.

Figure 9:
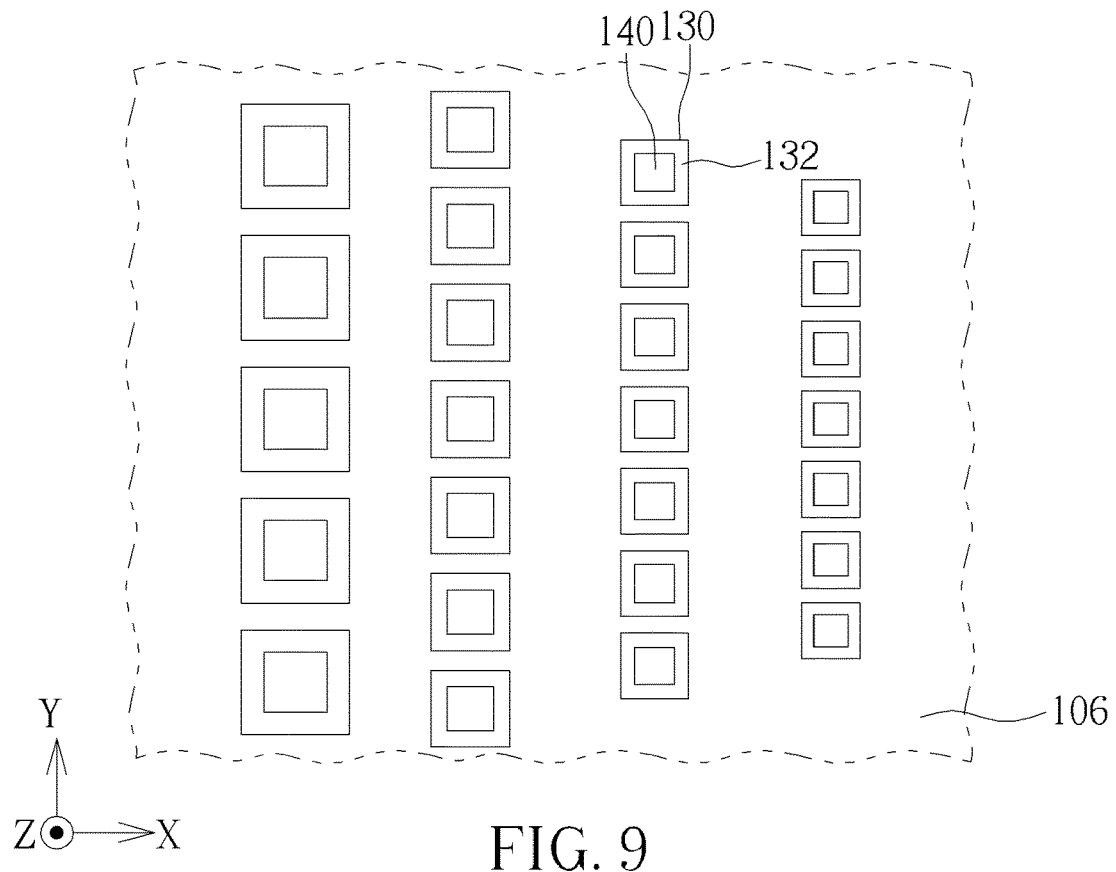
FIG. 9 is a schematic plan-view of a portion of a high electron mobility transistor according to an embodiment of the present invention.

According to the embodiment shown in FIG. 9, the protruding portions 144 and the trenches 130 may respectively have an approximately square shape (or a circular shape), and the protruding portions 144 are respectively arranged in a corresponding one of the trenches 130. The dimensions of the protruding portions 144 and the corresponding trenches 130 may vary according to the distances from the gate structure. For example, as shown in FIG. 9, the protruding portions 144 and the corresponding trenches 130 closer to the gate structure (at the left portion of FIG. 9) may have dimensions larger than the protruding portions 144 and the corresponding trenches 130 farther from the gate structure (at the right portion of FIG. 9).

The various arrangements of the trenches 130 and the protruding portions 144 as illustrated previously may be obtained by designing the patterning process of the trenches 130 as shown in FIG. 2 and the patterning process of the protruding portions 144 as shown in FIG. 4. For example, the arrangement as shown in FIG. 5 may be obtained through the steps of forming the trenches 130 in the first passivation layer 108, forming the second passivation layer 132 on the first passivation layer 108 and covering along the sidewalls and bottom surfaces of the trenches 130, and then forming the conductive material of the protruding portions 144 on the second passivation layer 132 and filling the remaining spaces of the trenches 130. The arrangement as shown in FIG. 6 may be obtained through the steps of forming the trenches 130 in the first passivation layer 108, forming the second passivation layer 132 on the first passivation layer 108 and completely filling the trenches 130, performing another patterning process to define a plurality of trenches (not shown) in the second passivation layer 132 in the trenches 130 that are corresponding to the protruding portions 144, and then forming the conductive material of the protruding portions 144 on the second passivation layer 132 and filling the trenches in the second passivation layer 132.

FIG. 10A, FIG. 10B, FIG. 10C, and FIG. 10D are schematic cross-sectional views of the high electron mobility transistors (HEMT) along the XZ plane according to some embodiments of the present invention, illustrating some examples of the depths of the trenches 130 and the protruding portions 144 of the conductive plate structure 140 extending in the 103 stacked structure.

Figure 10A:
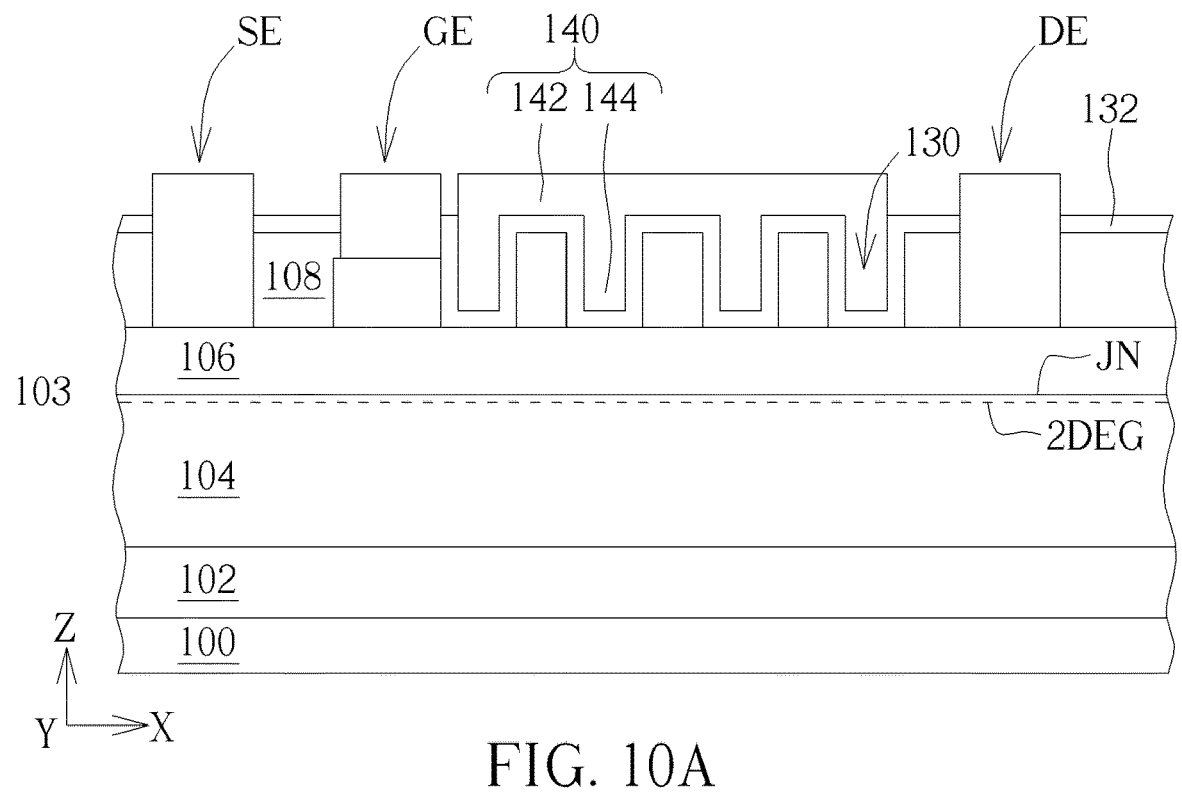
FIG. 10A is a schematic cross-sectional view of a high electron mobility transistor according to an embodiment of the present invention.

According to the embodiment as shown in FIG. 10A, the trenches 130 may penetrate through the first passivation layer 108 and do not extend into the barrier layer 106. The bottom surfaces of the trenches 130 may be substantially flush with the upper surface of the barrier layer 106. The bottom portions of the protruding portions 144 of the conductive plate structure 140 are located above the upper surface of the barrier layer 106 and are separated from the barrier layer 106 by the second passivation layer 132.

Figure 10B:
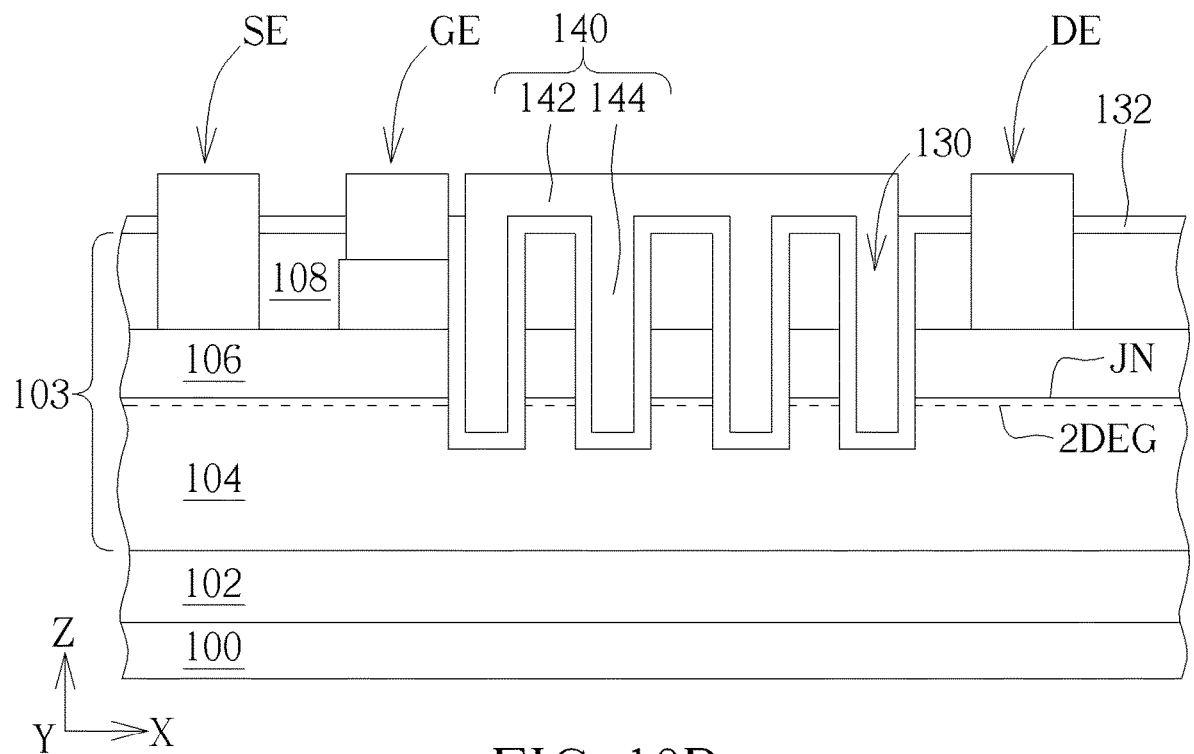
FIG. 10B is a schematic cross-sectional view of a high electron mobility transistor according to an embodiment of the present invention.

According to the embodiment shown in FIG. 10B, the trenches 130 may penetrate through the first passivation layer 108 and the barrier layer 106, and may extend into an upper portion of the channel layer 104, such that the bottom portions of the trenches 130 may be surrounded by the two-dimensional electron gas layer 2DEG The bottom portions of the protruding portions 144 of the conductive plate structure 140 are located below the lower surface of the barrier layer 106 and are not in direct contact with the barrier layer 106 and the channel layer 104 for being intervened by the second passivation layer 132.

Figure 10C:
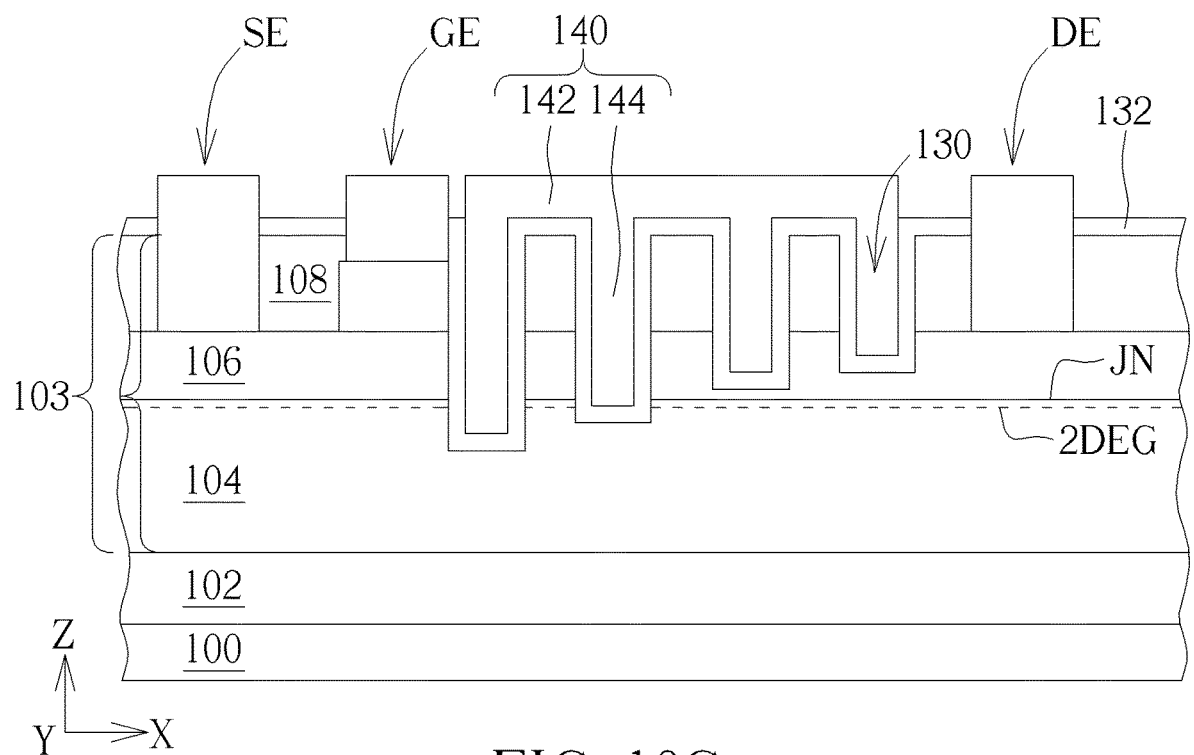
FIG. 10C is a schematic cross-sectional view of a high electron mobility transistor according to an embodiment of the present invention.

According to some embodiments of the present invention, the depths of the trenches 130 may vary, so that the vertical lengths (lengths along the Z direction, for example) of the protruding portions 144 of the conductive plate structure 140 may vary. For example, according to the embodiment shown in FIG. 10C, the depth of the trench 130 closer to the gate structure GE may be larger than the depth of the trench 130 farther from the gate structure GE. According to some embodiments of the present invention, some of the trenches 130 may penetrate through the first passivation layer 108 and the barrier layer 106, and may extend into an upper portion of the channel layer 104, so that the bottom portions thereof may be surrounded by the two-dimensional electron gas layer 2DEG The other of the trenches 130 may penetrate through the first passivation layer 108 and not extend into the barrier layer 106, and may have the bottom portions located above the two-dimensional electron gas layer 2DEG According to some embodiments of the present invention, it is also possible to choose that all of the trenches 130 with different depths do not penetrate through the barrier layer 106, having the bottom portions located above the two-dimensional electron gas layer 2DEG Likewise, it is also possible to choose that all of the trenches 130 with different depths penetrate through the barrier layer 106, having the bottom portions located below the lower surface of the barrier layer 106 and surrounded by the two-dimensional electron gas layer 2DEG It should be understood that the gradually varied depths of the trench 130 based on the distances from the gate structure GE as illustrated in FIG. 10C is only an example, and is not used to limit the scope of the present invention. Other designs of the depths of the trench 130 are applicable in the present invention according to device needs.

Figure 10D:
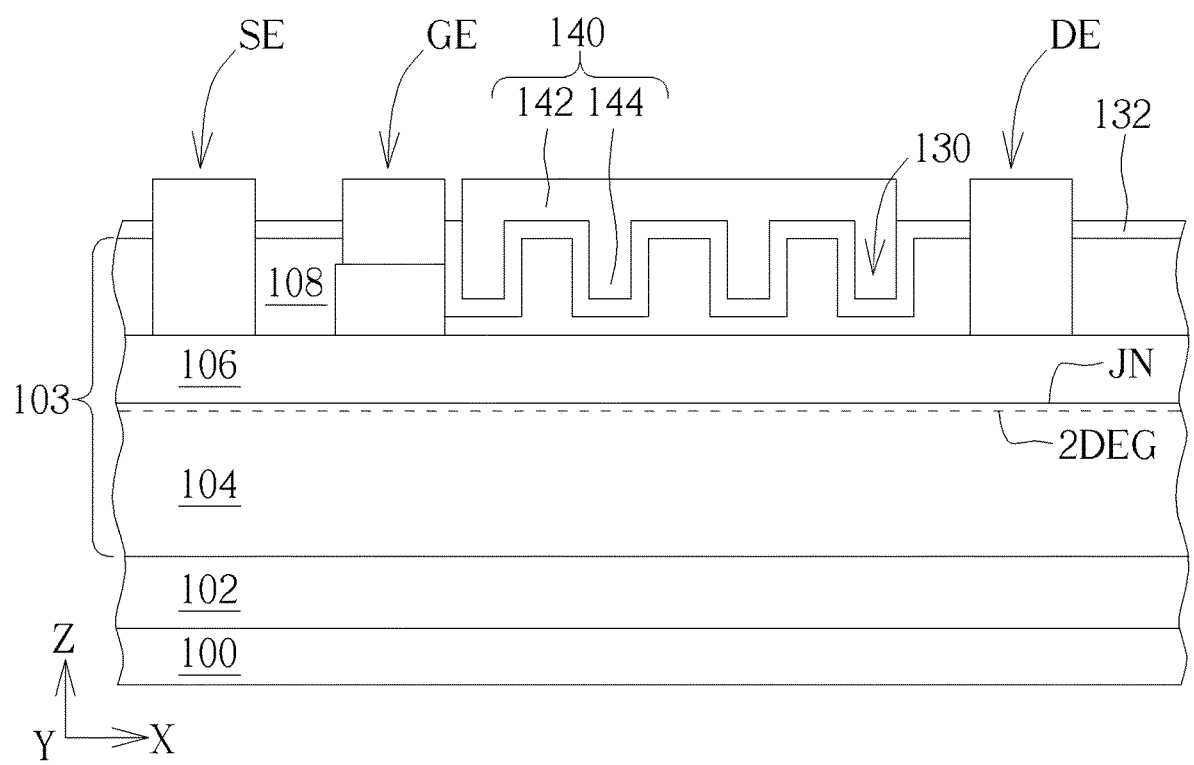
FIG. 10D is a schematic cross-sectional view of a high electron mobility transistor according to an embodiment of the present invention.

According to the embodiment shown in FIG. 10D, the trenches 130 may only penetrate through a portion of the first passivation layer 108 and not expose the barrier layer 106. The bottom portions of all of the trenches 130 are located above the upper surface of the barrier layer 106. The bottom portions of all of the protruding portions 144 of the conductive plate structure 140 are also located above the upper surface of the barrier layer 106, and are separated from the barrier layer 106 by the first passivation layer 108 and the second passivation layer 132. In some cases, when the sidewalls and bottom surfaces of the trenches 130 are completely surrounded by the first passivation layer 108, the second passivation layer 132 may be omitted.

FIG. 11, FIG. 12, FIG. 13 and FIG. 14 are schematic cross-sectional views of the high electron mobility transistors (HEMT) according to some embodiments of the present invention, showing some examples of the electrical interconnecting configurations of the conductive plate structure 140, the gate structure GE, the source structure SE, and the drain structure DE through the interconnecting structures disposed on the stacked structure 103. It should be noticed that the configuration of the conductive plate structure 140 shown in FIG. 11, FIG. 12, FIG. 13 or FIG. 14 is only an example for the purpose of illustration. In other embodiments, the conductive plate structure 140 may have other configurations such as the examples shown in FIG. 4, FIG. 5, FIG. 6, FIG. 7, FIG. 8, FIG. 9, FIG. 10A, FIG. 10B, FIG. 10C, and FIG. 10D, or other configurations within the scope of the present invention.

Figure 11:
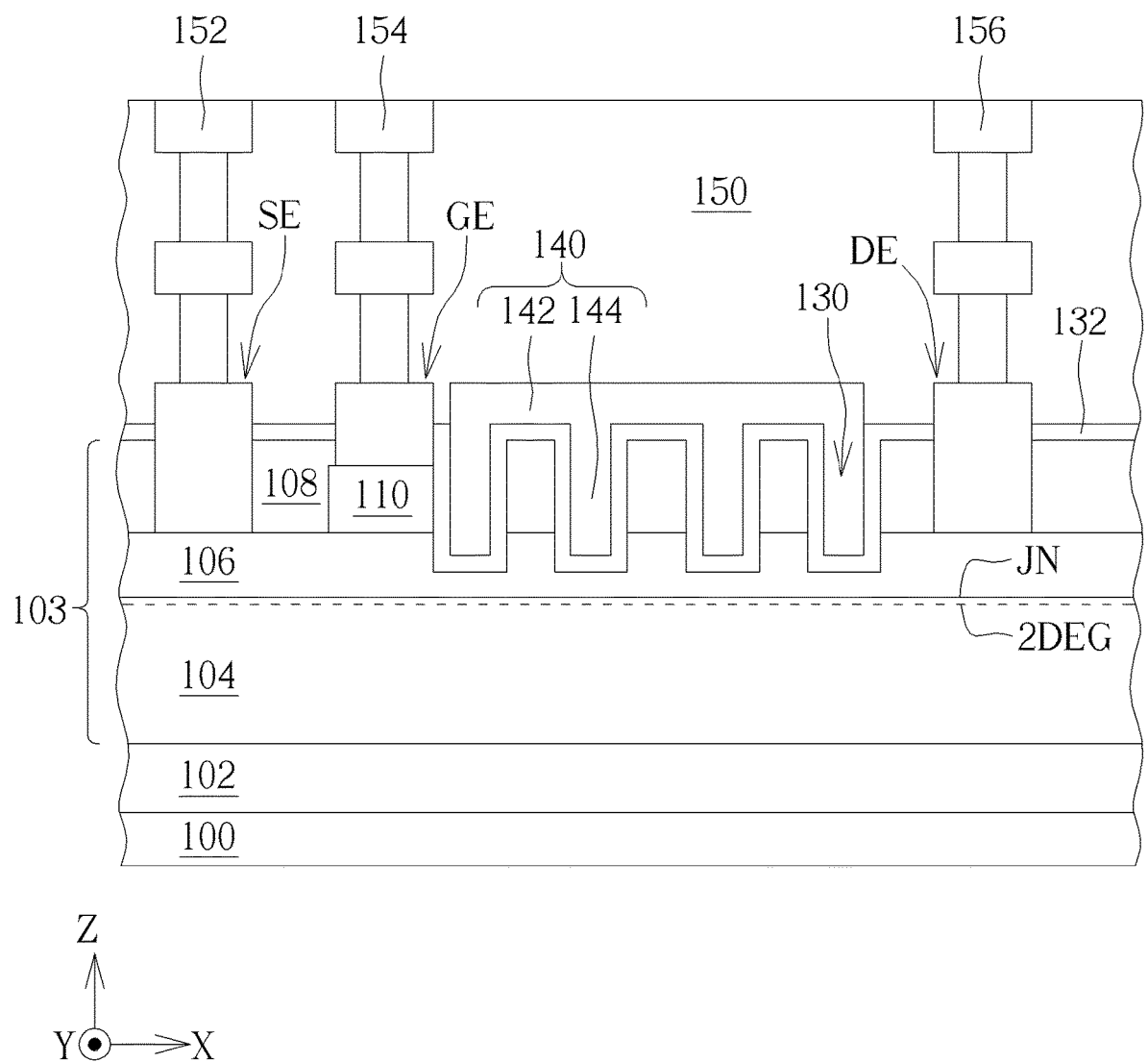
FIG. 11 is a schematic cross-sectional view of a high electron mobility transistor according to an embodiment of the present invention.

According to the embodiment shown in FIG. 11, the gate structure GE, the source structure SE, and the drain structure DE are electrically connected to the interconnecting structure 154, the interconnecting structure 152, and the interconnecting structure 156, respectively, for being electrically connected to suitable driving voltages. The conductive plate structure 140 is not electrically connected to any interconnecting structure, and is substantially electrically floating.

Figure 12:
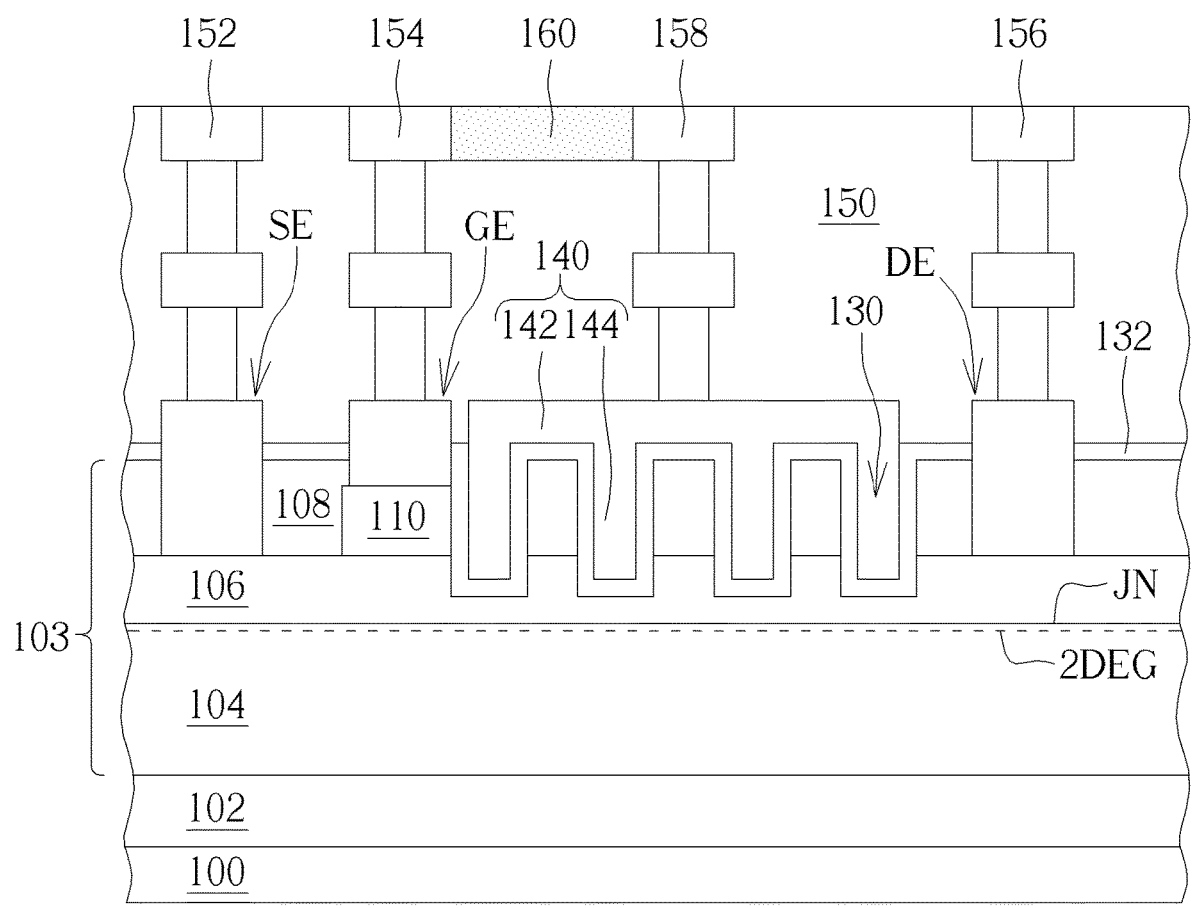
FIG. 12 is a schematic cross-sectional view of a high electron mobility transistor according to an embodiment of the present invention.

According to the embodiment shown in FIG. 12, the conductive plate structure 140 may be electrically connected to the interconnecting structure 158, and further electrically connected to the gate structure GE through the interconnecting structure 158 and the interconnecting structure 154. In this case, the conductive plate structure 140 and the gate structure GE may be electrically connected to a same gate voltage. Optionally, a resistor 160 or other types of circuit components may be electrically connected between the interconnecting structure 158 and the interconnecting structure 154.

Figure 13:
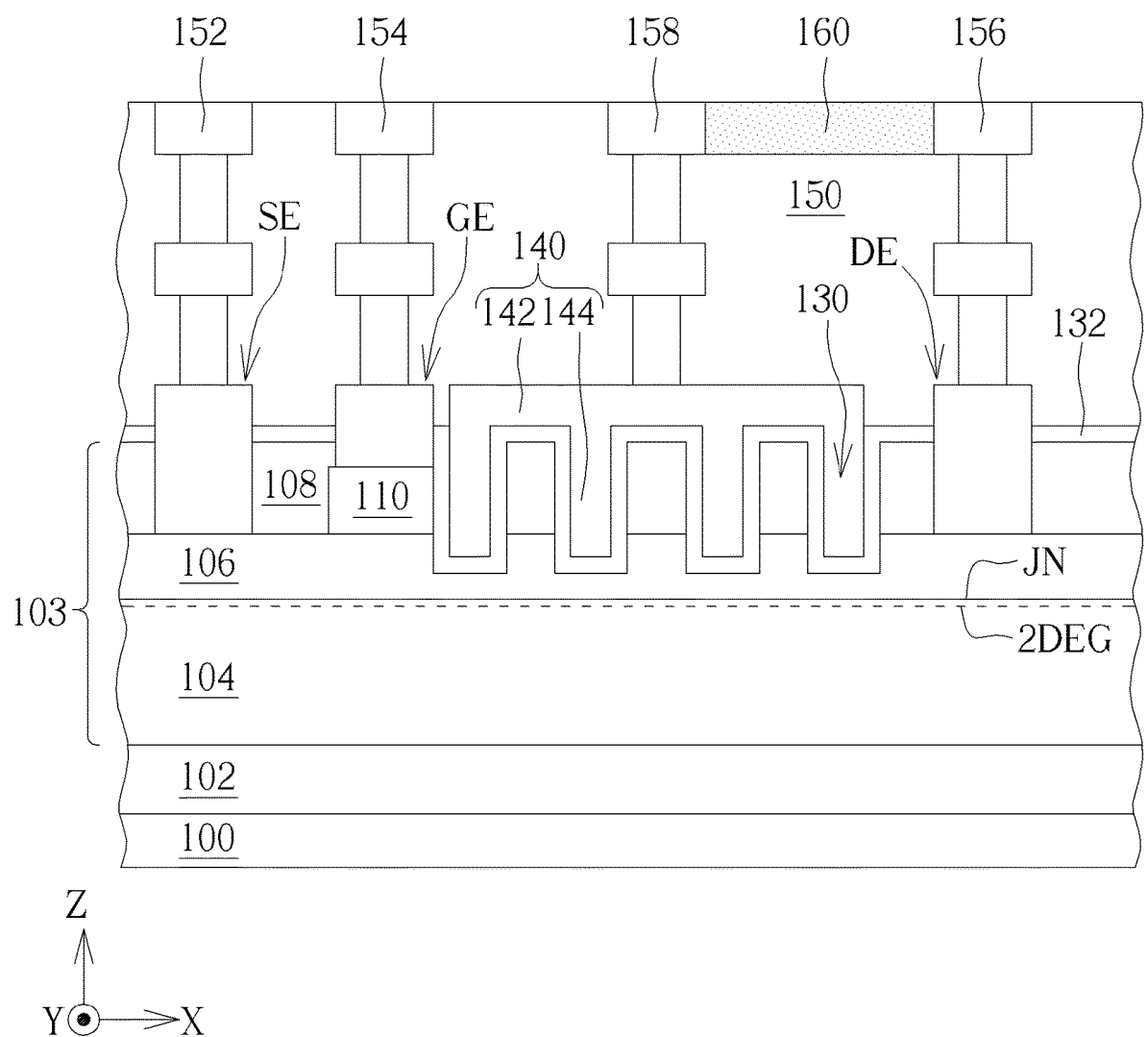
FIG. 13 is a schematic cross-sectional view of a high electron mobility transistor according to an embodiment of the present invention.

According to the embodiment shown in FIG. 13, the conductive plate structure 140 and the drain structure DE may be electrically connected through the interconnecting structure 158 and the interconnecting structure 156, and may be electrically connected to a same drain voltage. Optionally, a resistor 160 or other types of circuit components may be electrically connected between the interconnecting structure 158 and the interconnecting structure 156.

Figure 14:
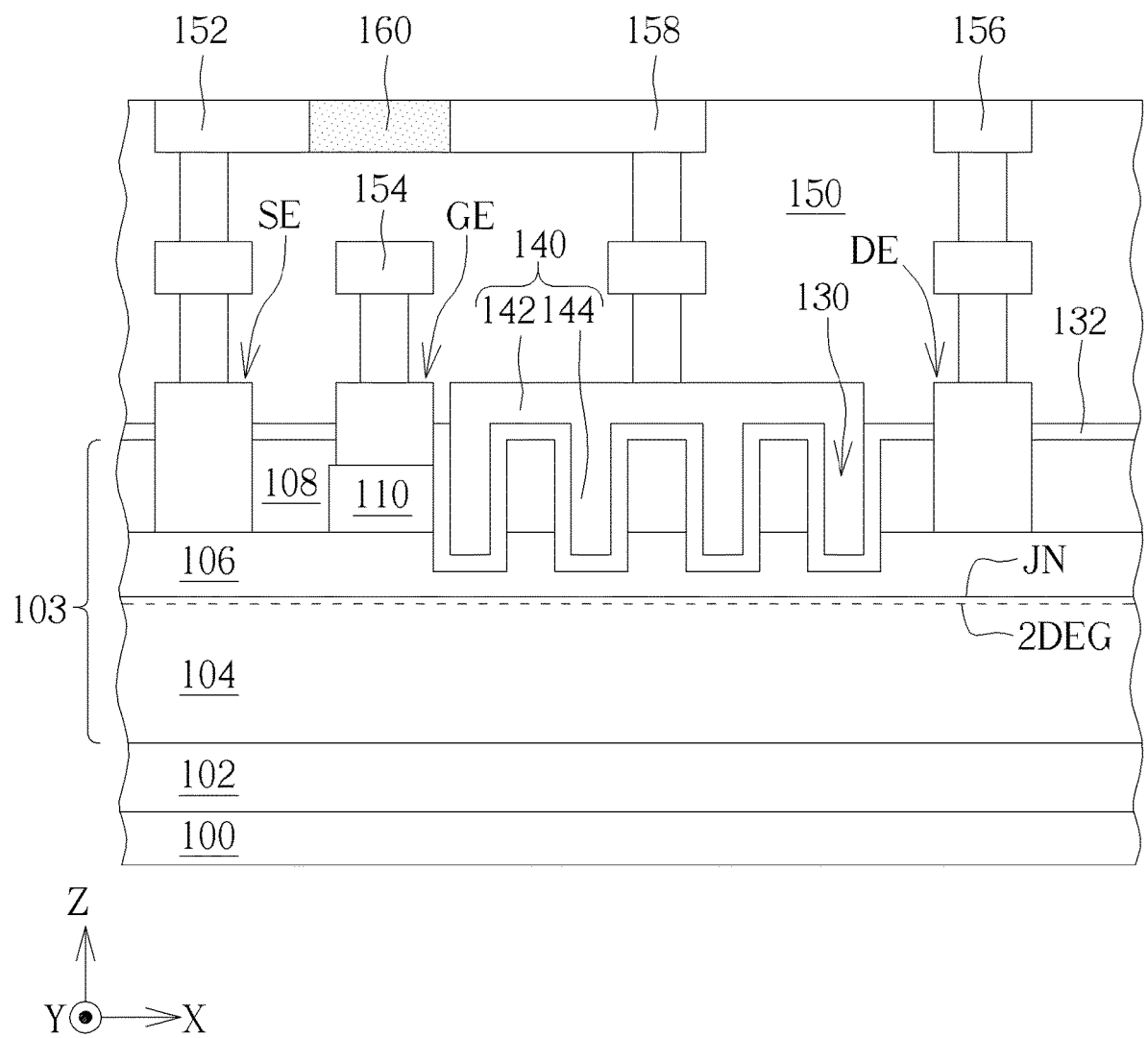
FIG. 14 is a schematic cross-sectional view of a high electron mobility transistor according to an embodiment of the present invention.

According to the embodiment shown in FIG. 14, the conductive plate structure 140 and the source structure SE may be electrically connected through the interconnecting structure 158 and the interconnecting structure 152, and may be electrically connected to a same source voltage. Optionally, a resistor 160 or other types of circuit components may be electrically connected between the interconnecting structure 158 and the interconnecting structure 152.

It should be understood that, in some embodiments of the present invention, it is also possible to choose the conductive plate structure 140 not to be electrically connected the gate structure GE, the source structure SE, or the drain structure DE, but to be electrically connected to a field plate voltage.

According to an embodiment of the present invention, the interconnecting structures 152, 154, 156, and 158 may respectively comprise conductive materials, such as metals including gold (Au), tungsten (W), cobalt (Co), nickel (Ni), titanium (Ti), molybdenum (Mo), copper (Cu), aluminum (Al), tantalum (Ta), palladium (Pd), platinum (Pt), a compound of the above materials, a composite layer of the above materials, or an alloy of the above materials, but is not limited thereto. The interconnecting structures 152, 154, 156, and 158 may be formed in the interlayer dielectric layer 150 on the stacked structure 103. The interlayer dielectric layer 150 may include dielectric materials such as silicon oxide ($SiO_2$) or low-k dielectric materials. Examples of the low-k dielectric materials may include fluorinated silica glass (FSG), silicon carbide (SiCOH), spin-on glass, porous low-k dielectric materials, or organic polymer dielectric material, but is not limited thereto. According to an embodiment of the present invention, the resistor 160 may be made of high-resistance metals, metal oxides, or low-temperature polysilicon, but is not limited thereto. In some cases, the function of the resistor may be obtained by adjusting the dimensions and lengths of the interconnecting structures to increase the resistance of a portion of the interconnecting structures.

By selecting appropriate electrical interconnecting configurations as illustrated in FIG. 11 to FIG. 14 according to design needs, the strength of the electric field in the high electron mobility transistor may be adjusted, and the current gain of the high electron mobility transistor may be increased. Furthermore, by electrically connecting a resistor in the driving circuit of the high electron mobility transistor, the high-frequency oscillation stability may be improved.

Figure 15:
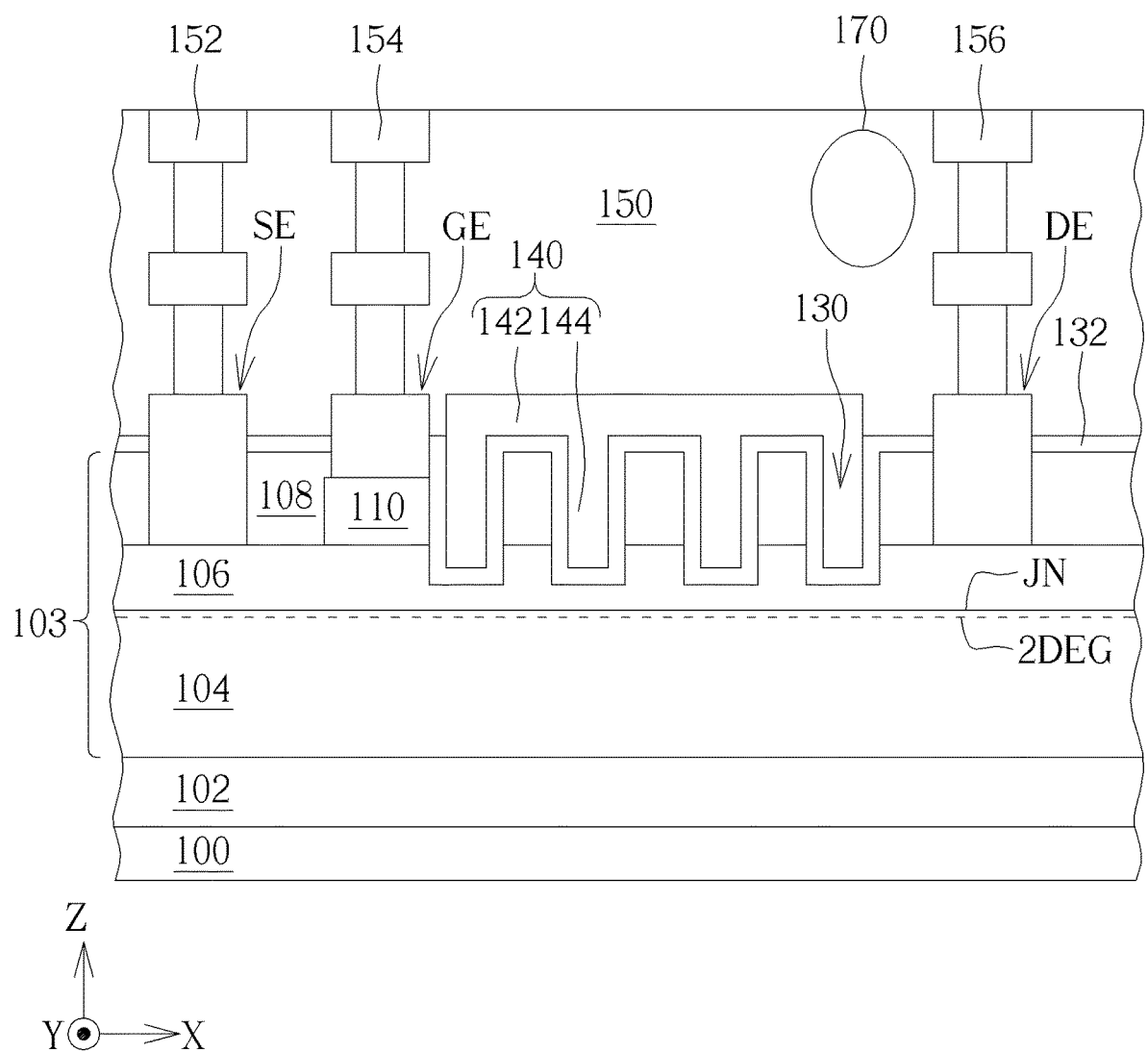
FIG. 15 is a schematic cross-sectional view of a high electron mobility transistor according to an embodiment of the present invention.

FIG. 15 is a schematic cross-sectional view of a high electron mobility transistor according to an embodiment of the present invention, showing that at least an air gap 170 may be formed in appropriate portions of the interlayer dielectric layer 150, such as between the portions of the interlayer dielectric layer 150 between the interconnecting structures. The air gap 170 may reduce the parasitic capacitances between the interconnecting structures, and may also improve the high-frequency oscillation stability of the high electron mobility transistor. The air gap 170 may be formed by, for example, etching a trench in the interlayer dielectric layer 150 and then forming another interlayer dielectric layer on the interlayer dielectric layer 150 to seal the air gap 170 in the trench.

In conclusion, the high electron mobility transistor (HEMT) provided by the present invention has a conductive plate structure disposed between a gate structure and a drain structure of the HEMT, which particularly has a base portion and a plurality of protruding portions extending from a lower surface of the base portion toward the channel layer of the HEMT. By selecting appropriate electrical interconnecting configurations of the conductive plate structure, the gate structure, the source structure, and the drain structure of the HEMT according to design needs, the strength of the electric field in the HEMT may be adjusted, and the peak value of the electric field near the edge of the gate structure may be reduced. In this way, the gate leakage current may be reduced, and the breakdown voltage may be increased. The reliability of the HEMT provided by the present invention may also be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor, comprising:
   a substrate;
   a channel layer disposed on the substrate;
   a barrier layer disposed on the channel layer;
   a first passivation layer disposed on the barrier layer;
   a plurality of trenches through at least a portion of the first passivation layer;
   a second passivation layer on the first passivation layer and along sidewalls and bottom surfaces of the plurality of trenches; and
   a conductive plate structure disposed on the second passivation layer and comprising:
   a base portion over the trenches; and
   a plurality of protruding portions extending from a lower surface of the base portion and into the trenches.

2. The high electron mobility transistor according to claim 1, wherein the trenches penetrate through a portion of the first passivation layer and do not expose the barrier layer.

3. The high electron mobility transistor according to claim 2, wherein bottom portions of the protruding portions are located above an upper surface of the barrier layer.

4. The high electron mobility transistor according to claim 1, wherein the trenches penetrate through the first passivation layer and extend into an upper portion of the barrier layer.

5. The high electron mobility transistor according to claim 4, wherein bottom portions of the protruding portions are located between an upper surface and a lower surface of the barrier layer and are separated from the barrier layer by the second passivation layer.

6. The high electron mobility transistor according to claim 1, wherein the trenches penetrate through the first passivation layer and the barrier layer and extend into an upper portion of the channel layer.

7. The high electron mobility transistor according to claim 6, wherein bottom portions of the protruding portions are located below a lower surface of the barrier layer and are separated from the barrier layer and the channel layer by the second passivation layer.

8. The high electron mobility transistor according to claim 1, wherein:
a portion of the trenches penetrate through the first passivation layer and the barrier layer and extend into an upper portion of the channel layer; and
another portion of the trenches penetrate through the first passivation layer and extend into an upper portion of the barrier layer.

9. The high electron mobility transistor according to claim 8, wherein:
bottom portions of a portion of the protruding portions are located below a lower surface of the barrier layer and separated from the barrier layer and the channel layer by the second passivation layer; and
bottom portions of another portion of the protruding portions are located between an upper surface and a lower surface of the barrier layer and are separated from the barrier layer by the second passivation layer.

10. The high electron mobility transistor according to claim 1, wherein the protruding portions respectively correspond to one of the trenches.

11. The high electron mobility transistor according to claim 1, wherein the protruding portions are grouped into a plurality of groups, wherein each of the trenches corresponds to one of the groups of the protruding portions.

12. The high electron mobility transistor according to claim 1, wherein the conductive plate structure comprise metal.

13. The high electron mobility transistor according to claim 1, further comprising:
a gate structure through the first passivation layer and directly contacting the barrier layer;
a source structure and a drain structure disposed at two sides of the gate structure and through the first passivation layer and directly contacting the barrier layer, wherein the conductive plate structure is between the gate structure and the drain structure.

14. The high electron mobility transistor according to claim 13, further comprising:
an interlayer dielectric layer disposed on the first passivation layer; and
a plurality of interconnecting structures disposed in the interlayer dielectric layer, wherein the gate structure, the source structure, and the drain structure are respectively electrically connected to one of the interconnecting structures.

15. The high electron mobility transistor according to claim 14, wherein the conductive plate structure and one of the gate structure, the source structure, and the drain structure are electrically connected through the interconnecting structures.

16. The high electron mobility transistor according to claim 14, further comprising a resistor disposed in the interlayer dielectric layer and electrically connected between the conductive plate structure and one of the gate structure, the source structure, and the drain structure.

17. The high electron mobility transistor according to claim 14, further comprising at least an air gap disposed in the interlayer dielectric layer.

18. The high electron mobility transistor according to claim 1, wherein the conductive plate structure is electrically floating.

19. The high electron mobility transistor according to claim 1, further comprising a buffer layer disposed between the substrate and the channel layer.

* * * * *